(12) United States Patent
Ma et al.

(10) Patent No.: US 8,338,250 B2
(45) Date of Patent: Dec. 25, 2012

(54) PROCESS FOR FABRICATING MEMORY DEVICE

(75) Inventors: Chu-Ming Ma, Hsinchu (TW); Tian-Shuan Luo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 544 days.

(21) Appl. No.: 12/354,615

(22) Filed: Jan. 15, 2009

(65) Prior Publication Data

US 2010/0176434 A1    Jul. 15, 2010

(51) Int. Cl.
*H01L 29/788* (2006.01)
*H01L 21/336* (2006.01)

(52) U.S. Cl. ........................................ 438/257; 438/294

(58) Field of Classification Search .......... 438/257–265, 438/E29.129, E29.3
See application file for complete search history.

(56) References Cited

U.S. PATENT DOCUMENTS

| | | | |
|---|---|---|---|
| 5,594,688 A | 1/1997 | Sato | |
| 6,171,909 B1 | 1/2001 | Ding et al. | |
| 6,583,008 B2 * | 6/2003 | Lee et al. | 438/257 |
| 7,038,268 B2 * | 5/2006 | Kinoshita et al. | 257/317 |
| 7,759,263 B2 * | 7/2010 | Sohn et al. | 438/787 |
| 7,785,964 B2 * | 8/2010 | Park et al. | 438/263 |
| 7,829,931 B2 * | 11/2010 | Park et al. | 257/315 |
| 7,919,809 B2 * | 4/2011 | Lee et al. | 257/316 |
| 2007/0111441 A1 | 5/2007 | Koh et al. | |

FOREIGN PATENT DOCUMENTS

| | | |
|---|---|---|
| CN | 1391286 | 1/2003 |
| TW | 449883 | 8/2001 |
| TW | 1285430 | 8/2007 |

OTHER PUBLICATIONS

Chinese First Examination Report of China Application No. 200910134444.3, dated Feb. 11, 2011.

* cited by examiner

*Primary Examiner* — Cuong Q Nguyen
(74) *Attorney, Agent, or Firm* — J.C. Patents

(57) ABSTRACT

A memory device is described, including a substrate, data storage structures over the substrate, control gates over the data storage structures, and a dielectric layer between the data storage structures and the control gates, wherein each data storage structure includes a lower part and an upper part narrower than the lower part. A process for fabricating the memory device is also described, wherein formation of the data storage structures includes recessing portions of a data storage layer to form respective upper parts of the data storage structures and then dividing the recessed portions of the data storage layer to form respective lower parts of the data storage structures.

13 Claims, 2 Drawing Sheets

PROCESS FOR FABRICATING MEMORY DEVICE

BACKGROUND OF THE INVENTION

1. Field of Invention

This invention relates to semiconductor device and fabrication thereof, and more particularly to a data storage structure, a memory device including the floating gate in duplicates, and a process for fabricating the memory device.

2. Description of Related Art

A conventional non-volatile memory (NVM) cell includes a stacked structure of a floating gate as a data storage structure and a control gate disposed thereon, operated by injecting carriers into the floating gate and removing carriers from the floating gate.

In a typical NVM using floating gates, the floating gates of the memory cells are arranged in a 2D array, wherein the gap between two neighboring floating gates in the direction of the word lines is usually close to the limit of the lithographic resolution to increase the surface area for each floating gate as well as the gate coupling ratio (GCR) between a floating gate and the corresponding control gate.

However, when the process linewidth is small, the aspect ratio of the above gap is high so that the control gate fill-in window is small. Moreover, since the above gap is close to the limit of the lithographic resolution, the lithographic overlap window in forming the floating gates is small.

SUMMARY OF THE INVENTION

In view of the foregoing, this invention provides a data storage structure of a memory cell.

This invention also provides a structure of a memory device that includes the data storage structure of this invention in duplicates.

This invention further provides a process for fabricating a memory device that includes the data storage structure of this invention in duplicates.

The data storage structures of a memory cell of this invention includes a lower part and an upper part narrower than the lower part.

The memory device of this invention includes a substrate, a plurality of duplicates of the data storage structure of this invention over the substrate, a plurality of control gates over the data storage structures, and a dielectric layer between the data storage structures and the control gates.

In an embodiment, the above data storage structure includes a floating gate.

In an embodiment, the data storage structure stores data by means of charges.

In an embodiment, the center of the lower part of each data storage structure is substantially aligned with that of the upper part of the data storage structure.

In an embodiment, the memory device of this invention further includes in the substrate an isolation structure overlapping the lower part of each data storage structure.

The process for fabricating a memory device of this invention includes the following steps at least. A plurality of portions of a data storage layer is recessed to form respective upper parts of a plurality of data storage structures. The recessed portions of the data storage layer are then divided to form respective lower parts of the data storage structures, wherein the upper part is narrower than the lower part in each data storage structure.

In an embodiment, the step of dividing the recessed portions of the data storage layer includes forming spacers on the sidewalls of the upper parts of the data storage structures and then etching through the first portions of the data storage layer with the spacers as an etching mask.

In an embodiment, the step of recessing the portions of the data storage layer includes forming over the data storage layer a patterned hard mask layer covering the upper parts of the data storage structures but exposing the portions of the data storage layer, and etching the portions of the data storage layer.

In an embodiment, the data storage layer includes a conductive layer.

In an embodiment, each data storage structure includes a floating gate.

In an embodiment, the process further includes forming an isolation structure before the step of recessing the portions of the data storage layer, wherein the portions of the data storage layer overlap the isolation structure.

Since a data storage structure of this invention, which may be formed with the process of this invention, has an upper part narrower than the lower part thereof, the aspect ratio of the gap between two neighboring data storage structures is decreased so that the control gate fill-in window is increased for the gap.

Moreover, in a case where the relatively narrower upper parts of the data storage structures are defined by lithography and the relatively wider lower parts of the same are self-aligned to the upper parts, for example, a case where the upper parts are defined by a patterned hard mask layer and the lower parts defined by spacers on the sidewalls of the upper parts, the lithographic overlap window in the formation of the data storage structures is increased.

Furthermore, the step-like profile of the data storage structure can reduce the coupling effect between two neighboring data storage structures.

In order to make the aforementioned and other objects, features and advantages of this invention comprehensible, a preferred embodiment accompanied with figures is described in detail below.

DESCRIPTION OF EMBODIMENTS

This invention is further explained with the following embodiment in reference of FIGS. 1-6, but is not restricted thereto in scope. For example, though the data storage layer and the data storage structure in the memory device or the process of this invention are respectively exemplified by a conductive layer and a floating gate in the embodiment, they are not limited to the latter. In addition, the upper parts of the floating gates may alternatively be defined using a patterned photoresist layer having chemically enhanced resistivity, instead of a patterned hard mask, as an etching mask.

Figure 1:
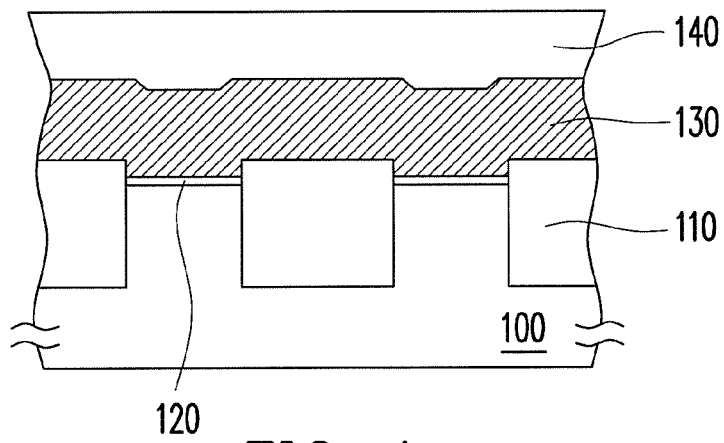
FIGS. 1-6 illustrate, in a cross-sectional view, a process for fabricating a memory device according to an embodiment of this invention, wherein FIG. 6 also illustrates the data storage structure and the memory device according to the embodiment.

Referring to FIG. 1, a substrate 100 is provided, possibly being a lightly doped single-crystal silicon substrate. An isolation layer 110 is then formed in the substrate, possibly being a shallow trench isolation (STI) structure and including $SiO_2$.

Thereafter, a tunneling layer 120, a conductive layer 130 as a type of the data storage layer of this invention and a hard mask layer 140 are sequentially formed over the substrate. The tunneling layer 120 may include silicon oxide, and may have a thickness of 60-120 angstroms. The conductive layer 130 may include doped polysilicon, and may have a thickness of 500-2000 angstroms. The hard mask layer 140 may include silicon nitride, and may have a thickness of 1000-2000 angstroms depending on the thickness of the conductive layer 130 and the recipe of the later etching processes done to the conducting layer 130.

Figure 2:
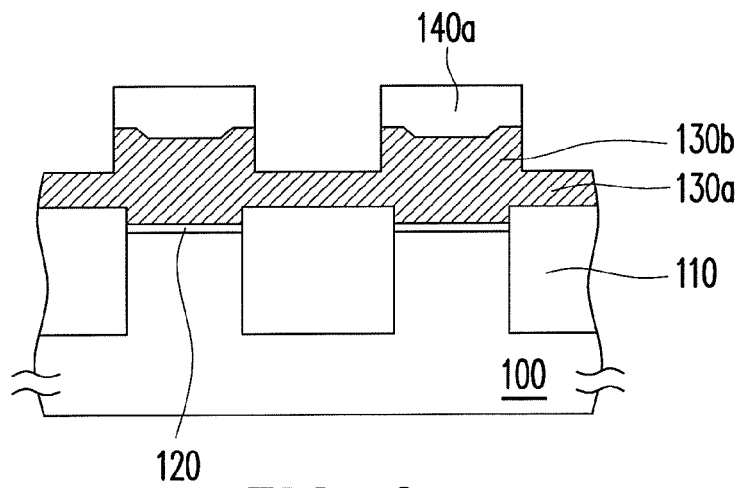

Referring to FIG. 2, the hard mask layer 140 is then patterned, usually with a lithography process and a subsequent etching process, to form a patterned hard mask layer 140a that exposes portions 130a of the conducting layer 130 for forming the lower parts of the floating gates but covers portions of the conducting layer 130 for forming the relatively narrower upper parts of the floating gates. It is noted that the floating gate is a type of the data storage structure of this invention.

Then, that exposed portions 130a of the conducting layer 130 are recessed, with an etching process using the patterned hard mask layer 140a as a mask, to form upper parts 130b of the floating gates. A certain proportion of the patterned hard mask layer 140a is also consumed in the etching process.

Figure 3:
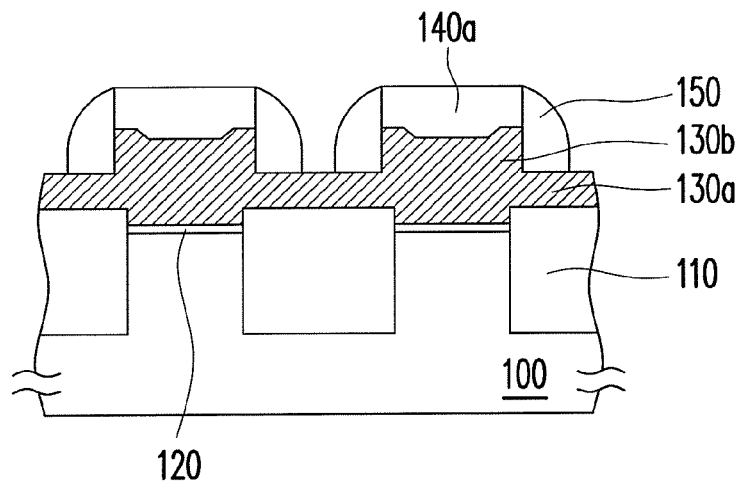

Referring to FIG. 3, a plurality of spacers 150 are formed on the sidewalls of the patterned hard mask layer 140a and the sidewalls of the upper parts 130b of the floating gates, over the recessed portions 130a of the conductive layer 130. The material of the spacers 150 may be silicon nitride, for example.

The spacers 150 may be formed by depositing a substantially conformal spacer material layer over the substrate 100 and then anisotropically etching the spacer material layer. It is noted that the width of the relatively wider lower part of each floating gate as well as the gap between two neighboring floating gates in the word line direction are determined by the width of the spacers 150, which is determined by the thickness of the spacer material layer.

Figure 4:
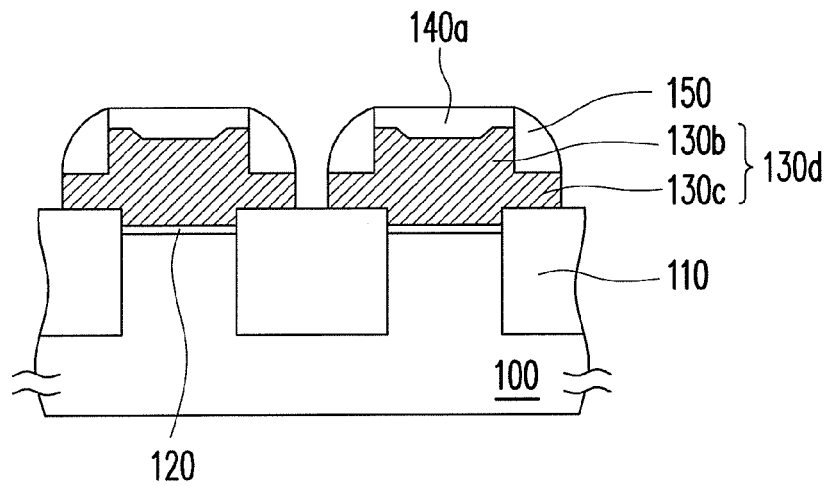

Referring to FIG. 4, the recessed portions 130a of the conducting layer 130 are etched through and divided with another etching process using the patterned hard mask layer 140a and the spacers 150 as etching masks, so as to form the lower parts 130c of the floating gates 130d. The recipe of this etching process may be the same as that of the earlier etching process for forming the upper parts 130b of the floating gates 130d.

Since the lower part 130c of a floating gate 130d is self-aligned to the upper part 130b of the same due to the spacer 150 on the sidewall of the upper part 130b, the center of the lower part 130c is substantially aligned with that of the upper part 130b. In addition, the lower part 130c overlaps the isolation structure 110. When the conducting layer 130 includes polysilicon, the lower part 130c and the upper part 130b of each floating gate 130d defined therefrom both comprise polysilicon.

Figure 5:
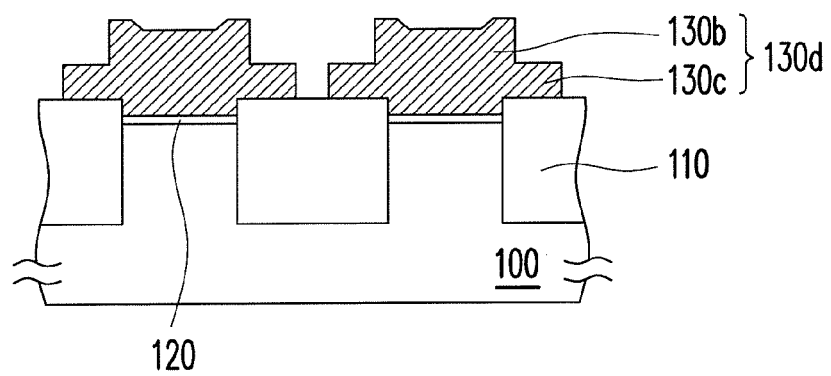

Referring to FIG. 5, the patterned hard mask layer 140a and the spacers 150 are then removed, possibly with hot phosphoric acid when they include silicon nitride.

Figure 6:
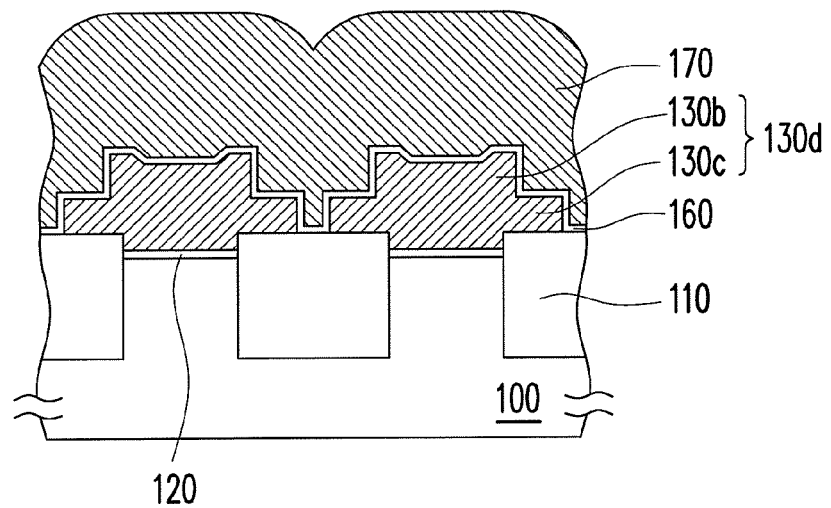

Referring to FIG. 6, a dielectric layer 160, such as an oxide/nitride/oxide (ONO) composite layer, is formed covering the floating gates 130d. Thereafter, a plurality of control gates 170 is formed on the dielectric layer 160 over the floating gates 130d. The control gates 170 also act as the word lines of the memory device in this embodiment. The material of the control gates 170 may be doped polysilicon.

Thereafter, it is possible to form source lines, buried drain regions and bit lines with any suitable process known in the prior art, so as to finish the manufacture of the memory device. The process is not described here as being known to those of ordinary in the prior art.

Since a floating gate 130d formed in this embodiment has an upper part 130b narrower than the lower part 130c thereof, the aspect ratio of the gap between two neighboring floating gates 130d is decreased so that the control gate fill-in window is increased for the gap.

Moreover, since the relatively narrower upper parts 130b of the floating gates 130d are defined by lithography (the patterned hard mask layer 140a) but the relatively wider lower parts 130c of the floating gates 130d are self-aligned to the upper parts 130b because of the spacers 150, the lithographic overlap window in forming the floating gates is small.

Furthermore, the step-like profile of the floating gate 130d can reduce the coupling effect between two neighboring floating gates 130d.

What is claimed is:

1. A process for fabricating a memory device, comprising:
   forming a patterned hard mask layer over a data storage layer;
   recessing a plurality of portions of the data storage layer to form respective upper parts of a plurality of data storage structures by an etching process, wherein the patterned hard mask layer is consumed in the etching process; and
   dividing the recessed portions of the data storage layer to form respective lower parts of the data storage structures, wherein the upper part is narrower than the lower part in each data storage structure,
   wherein the data storage layer has a thickness of 500-2000 angstroms.

2. The process of claim 1, wherein the step of dividing the recessed portions of the data storage layer comprises:
   forming spacers on sidewalls of the upper parts of the data storage structures; and
   etching through the recessed portions of the data storage layer with the spacers as an etching mask.

3. The process of claim 1, wherein the step of recessing the portions of the data storage layer comprises:
   forming over the data storage layer the patterned hard mask layer covering the upper parts of the data storage structures but exposing the portions of the data storage layer; and
   etching the portions of the data storage layer.

4. The process of claim 3, wherein the step of dividing the recessed portions of the data storage layer comprises:
   forming spacers on sidewalls of the patterned hard mask layer and sidewalls of the upper parts of the data storage structures; and
   etching through the recessed portions of the data storage layer with the patterned hard mask layer and the spacers as etching masks.

5. The process of claim 1, wherein the data storage layer comprises a conductive layer.

6. The process of claim 1, wherein each data storage structure comprises a floating gate.

7. The process of claim 1, further comprising forming an isolation structure before the step of recessing the portions of the data storage layer, wherein the recessed portions of the data storage layer overlap the isolation structure.

8. The process of claim 1, further comprising:
   sequentially forming a tunneling layer and the data storage layer on a substrate of the memory device before the step of recessing the portions of the data storage layer.

9. The process of claim 8, further comprising forming an isolation structure in the substrate before the tunneling layer and the data storage layer are formed, wherein the recessed portions of the data storage layer overlap the isolation structure.

10. The process of claim 1, further comprising, after the lower parts of the data storage structures are formed, forming a dielectric layer covering the data storage structures; and forming a plurality of control gates on the dielectric layer over the data storage structures.

11. The process of claim 1, wherein the patterned hard mask layer has a thickness of 1000-2000 angstroms.

12. A process for fabricating a memory device, comprising:

forming a patterned hard mask layer over a data storage layer;

recessing a plurality of portions of the data storage layer to form respective upper parts of a plurality of data storage structures by an etching process, wherein the patterned hard mask layer is consumed in the etching process;

forming a plurality of SiN spacers on sidewalls of the upper parts; and dividing the recessed portions of the data storage layer by the SiN spacers to form respective lower parts of the data storage structures, wherein the upper part is narrower than the lower part in each data storage structure.

13. The process of claim 12, wherein the patterned hard mask layer has a thickness of 1000-2000 angstroms.

* * * * *